(12) United States Patent
Lassen

(10) Patent No.: US 12,074,423 B2
(45) Date of Patent: Aug. 27, 2024

(54) TIMER CIRCUIT WITH AUTONOMOUS FLOATING OF PINS AND RELATED SYSTEMS, METHODS, AND DEVICES

(71) Applicant: Microchip Technology Incorporated, Chandler, AZ (US)

(72) Inventor: Jacob Lunn Lassen, Saupstad (NO)

(73) Assignee: Microchip Technology Incorporated, Chandler, AZ (US)

( * ) Notice: Subject to any disclaimer, the term of this patent is extended or adjusted under 35 U.S.C. 154(b) by 377 days.

(21) Appl. No.: 16/946,067

(22) Filed: Jun. 4, 2020

(65) Prior Publication Data
US 2021/0159688 A1 May 27, 2021

Related U.S. Application Data

(60) Provisional application No. 62/940,617, filed on Nov. 26, 2019.

(51) Int. Cl.
*H02H 1/00* (2006.01)
*G06F 11/07* (2006.01)
*H02H 3/027* (2006.01)

(52) U.S. Cl.
CPC ....... *H02H 1/0092* (2013.01); *G06F 11/0745* (2013.01); *G06F 11/079* (2013.01); *H02H 1/0007* (2013.01); *H02H 3/027* (2013.01)

(58) Field of Classification Search
CPC .... G06F 11/0745; G06F 11/07; G06F 11/075; G06F 11/079; H02H 1/0007; H02H 1/0092
See application file for complete search history.

(56) References Cited

U.S. PATENT DOCUMENTS

| | | | |
|---|---|---|---|
| 5,440,603 A | 8/1995 | Sugita | |
| 6,145,103 A | 11/2000 | Typaldos et al. | |
| 2002/0116670 A1 | 8/2002 | Oshima et al. | |
| 2003/0097487 A1* | 5/2003 | Rietze | G06F 9/4405 361/679.02 |
| 2003/0158700 A1* | 8/2003 | Forler | G06F 11/0757 714/E11.003 |
| 2012/0079328 A1* | 3/2012 | Sawaguchi | G06F 11/0757 714/47.1 |
| 2021/0096875 A1* | 4/2021 | Saito | G06F 9/485 |

OTHER PUBLICATIONS

International Search Report from International Application No. PCT/US2020/070122, mailed on Sep. 25, 2020, 4 pages.
International Written Opinion from International Application No. PCT/US2020/070122, mailed on Sep. 25, 2020, 20 pages.

* cited by examiner

Primary Examiner — Jared Fureman
Assistant Examiner — Christopher J Clark
(74) Attorney, Agent, or Firm — TraskBritt

(57) ABSTRACT

An electrical system includes an integrated circuit device including input/output (I/O) pins, a reset circuit, and an I/O circuit. The I/O circuit is operably coupled to the I/O pins. The I/O circuit is configured to selectively operate the I/O pins in an electrically floating state responsive to a system reset signal transmitted by the reset circuit. The I/O circuit is further configured to selectively operate the I/O pins in the electrically floating state responsive to a signal provided by a timer circuit independently from the reset circuit.

20 Claims, 5 Drawing Sheets

TIMER CIRCUIT WITH AUTONOMOUS FLOATING OF PINS AND RELATED SYSTEMS, METHODS, AND DEVICES

CROSS-REFERENCE TO RELATED APPLICATION

This patent application claims priority to U.S. Provisional Patent Application No. 62/940,617, filed Nov. 26, 2019, and titled WATCHDOG WITH NON-MASKABLE INTERRUPT AND AUTONOMOUS FLOATING OF PINS AND RELATED SYSTEMS, METHODS, AND DEVICES, the entire disclosure of which is hereby incorporated herein by this reference.

FIELD

The present disclosure relates generally to remedial action taken responsive to faults detected in operation of integrated circuits, and more specifically to remedial action taken in processing circuit devices.

BACKGROUND

A processing circuit may use a reset controller to initiate a system reset of the processing circuit. System resets are from a functional safety perspective intended to place the processing circuit in a safe state in which input/output (I/O) pins are set to electrically floating states. In safety critical systems such a processing circuit may avoid unsafe operation of external devices that interact with the processing circuit due to the operation of the I/O pins in a safe state.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
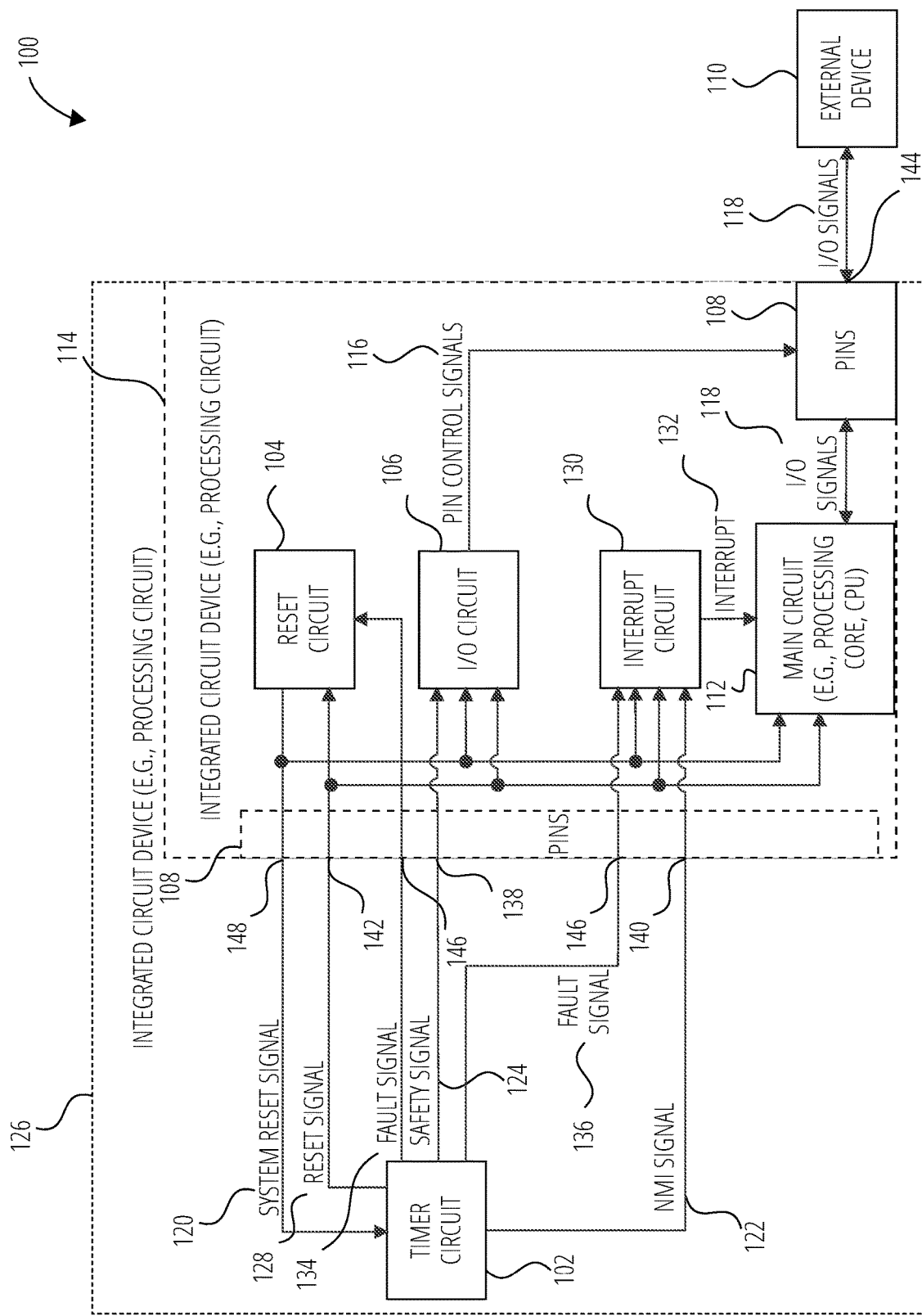
FIG. 1 is a block diagram of an electrical system, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an integrated circuit (IC), an Application Specific integrated circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Some processing circuits (e.g., microcontrollers, without limitation) may include built-in watchdog circuits, which are used to recover from faults (e.g., soft and/or hard faults, stack pointer failures, or unexpected program-flow, without limitation) that may not be handled otherwise. Safety critical systems may experience and consider multi-point failures. One non-limiting example of a potential multi-point failure can be that a critical fault, which would normally be recovered from by the watchdog circuit using a reset controller to reset the system, is combined with a fault in a reset controller. A reset controller may include logic that collects various (e.g., all, without limitation) reset sources and generates a master or system reset. A fault in the reset controller itself, however, may impair the intended system reset even if the watchdog circuit itself is not faulty. In other words, although a watchdog circuit may be configured to detect faults not handled by other mechanisms and cause the reset circuit to trigger a system reset, an additional fault in the reset controller itself may prevent a processing circuit from transitioning its I/O pins to a floating state or from initiating the system reset at all.

The intended behavior of a typical watchdog circuit, if a critical fault occurs, is to reset the microcontroller (e.g., via the reset controller, without limitation), which also floats the I/O pins (e.g., all the I/O pins, without limitation). Floating the I/O pins is considered a safe state in a safety critical system, since this is a normal situation until the microcontroller has started up. While watchdog circuits and windowed watchdog circuits trigger reset controllers to initiate system resets (e.g., internally in the processing circuit, without limitation), malfunctions in the reset controllers themselves may prevent the triggering of a safe state, and may even prevent system resets. By way of non-limiting example, a fault in the reset controller may prevent placement of the microcontroller in a safe state even if the watchdog circuit detects a fault.

As used herein, the term "windowed watchdog circuit" refers to a watchdog circuit that triggers both if a watchdog circuit timer overflows before it is cleared, or if the watchdog circuit timer is cleared earlier than expected. In other words, a windowed watchdog circuit triggers a system reset if the watchdog circuit timer is cleared outside normal operation, including a late or early watchdog circuit timer clearing.

Another non-limiting example of a potential multi-point failure can be that a fault, which would normally be recovered from by the watchdog circuit using an interrupt circuit to interrupt operation of the processing circuit (e.g., operation of a central processing unit of the processing circuit, without limitation), is combined with a fault in the interrupt controller. A fault in the interrupt controller itself, however, may impair the intended interrupt even if the watchdog circuit itself is not faulty. In other words, although a watchdog circuit is configured to detect faults and cause the interrupt circuit to trigger an interrupt, an additional fault in the interrupt controller itself may prevent the interrupt from occurring. In addition, interrupts of the interrupt controller itself may, in some instances, be disabled or the MCU may not be able to serve an interrupt received from the interrupt controller, which may impair the intended interrupt even if the watchdog circuit itself is not faulty.

Embodiments disclosed herein include timing circuits (e.g., watchdog circuits, without limitation) that are configured to independently trigger electrical floating of I/O pins (e.g., set to a safe state, without limitation), system resets, or combinations thereof without intervention from a reset circuit, a central processing unit (CPU), or an interrupt controller. Also, embodiments disclosed herein include timing circuits that are configured to independently trigger non-maskable interrupts (NMIs) without intervention from a reset circuit and independently from a state and configuration of an interrupt controller. By way of non-limiting example, timing circuits disclosed herein may trigger electrical floating of I/O pins while the CPU performs a main control loop—without interrupting the CPU. As another non-limiting example, timing circuits disclosed herein may trigger electrical floating of I/O pins while the CPU operates in a low power mode because the timing circuits disclosed herein have sufficient circuitry (e.g., logic, memory, without limitation) to trigger electrical floating of the I/O pins—here without waking-up the CPU. As a further non-limiting example, direct bus connections (e.g., a peripheral bus, or an event system that uses a peripheral bus, without limitation) between timing circuits disclosed herein and I/O circuitry and/or interrupt circuitry may be present, which may be used to communicate signals without interrupting operation of the CPU.

Embodiments disclosed herein may cause a non-maskable, high priority interrupt and float all the I/O pins independent of an interrupt controller. The NMI may enable software (e.g., executed by a CPU or other processing core, without limitation) to determine whether I/O pins are correctly floated. In some embodiments verification of correct operation of the watchdog circuit under normal conditions may be performed. In case of a failure it may not be assumed that the NMI operates properly (e.g., if a CPU fault triggered the watchdog circuit, without limitation), which is not a problem as long as the I/O pins have previously been verified to be electrically floated.

A timing circuit (e.g., watchdog circuit) that is configured to independently trigger electrical floating of I/O pins, NMIs, system resets, or combinations thereof, may increase the safety of safety critical systems. As a non-limiting example, if an intervening component that is configured to perform one or more of floating of I/O pins, NMIs, and system resets experiences a fault, the timing circuit may still perform the floating of I/O pins, NMIs, or system resets even in the presence of such a fault. In other words, embodiments disclosed herein may provide redundancy in the triggering of floating of I/O pins, NMIs, and system resets, reducing the probability that triggering of these safety features becomes unavailable for the integrated circuit device. Unsafe operation of safety critical systems resulting from un-remedied faults in operation of the integrated circuit device may be avoided. Embodiments disclosed herein may, additionally or alternatively, reduce or eliminate a critical double fault situation (e.g., fault of the reset circuit or interrupt circuit in addition to another fault detected by the watchdog circuit). An NMI may not be disabled and has a higher priority than other interrupts. As a result, NMIs will not be blocked and the interrupt circuit is required to serve the NMI. In embodiments disclosed herein, even if the interrupt controller, the reset controller and/or the CPU fails, the system will still be brought to a safe state by the timing circuit.

In some embodiments, the timing circuit (e.g., watchdog circuit, without limitation) may be integrated within an integrated circuit device. In such embodiments the need for an external (e.g., redundant, without limitation) watchdog circuit may be eliminated, therefore reducing system cost and enabling more compact design. In some embodiments the timing circuits may be implemented externally to the integrated circuit device.

In addition, embodiments of the disclosure may increase testability and/or observability of functions of an integrated circuit device. By way of non-limiting example, embodiments of the disclosure may enable a CPU of the integrated circuit device to read a count register (e.g., of the timer circuit, without limitation), set the count register to a predetermined state configured to rapidly trigger an overflow event (e.g., for test, without limitation), pull low a reset pin to signal externally that reset has occurred, and enable always enabled functionality (e.g., through fuses/configuration bits, without limitation).

As used herein, the term "processing circuit" refers to an integrated circuit device including electrically programmable logic. Examples of "processing circuits" include, but are not limited to, microcontrollers, programmable logic controllers (PLCs), computer processing cores, field programmable gate arrays (FPGAs), other circuitry configured to execute computer-readable instructions (e.g., software, firmware) or logic (e.g., hardware description language code), or combinations thereof.

As used herein the term "pin" refers to an electrically conductive structure electrically connecting circuitry internal to an integrated circuit device package (directly or via one or more intermediate devices (i.e., indirectly)) to circuitry that is external to the integrated circuit device package. Accordingly, a first end of a pin may be internal to the integrated circuit device package and a second end of the pin may be external to the integrated circuit device package. Pins of an integrated circuit device may be operably coupled to a pad of a printed circuit board (PCB), which may include traces electrically connected to the pad to enable connection of the circuitry that is internal to the integrated circuit device package to electrically interact with other components or devices electrically connected to the PCB through the pins, pads, and traces.

FIG. 1 is a block diagram of an electrical system 100, according to some embodiments. The electrical system 100 includes an integrated circuit device (e.g., integrated circuit device 126 or integrated circuit device 114, without limitation) and an external device 110 operably coupled to the integrated circuit device 114 or 126. In some embodiments the integrated circuit device 114 or 126 may be implemented as a processing circuit such as a microcontroller, without limitation. The integrated circuit device 114 or 126 includes a main circuit 112, a reset circuit 104, an I/O circuit 106, an interrupt circuit 130 and pins 108. In the case of the integrated circuit device 126, the integrated circuit device 126 also includes a timer circuit 102. In the case of the integrated circuit device 114 the timer circuit 102 is external to the integrated circuit device 114 (e.g., an external watchdog circuit, without limitation) and the timer circuit 102 is configured to interact with the integrated circuit device 114 via the pins 108 (e.g., a safety pin 138 configured to receive a safety signal 124 from the timer circuit 102, an interrupt pin 140 configured to receive an NMI signal 122 from the timer circuit 102, a reset pin 142 configured to receive a reset signal 128 from the timer circuit 102, one or more fault pins 146 configured to receive fault signals 134, 136 from the timer circuit 102, and a system reset pin 148 configured to provide a system reset signal 120 to the timer circuit 102). In other words, the electrical system 100 may include an integrated circuit device 114 operably coupled to a timer circuit 102 that is external to the integrated circuit device 114 (indicated using dashed lines) or an integrated circuit device 126 including the timer circuit 102 within a package of the integrated circuit device 126 (indicated using dotted lines), according to different embodiments. The integrated circuit device 114 or 126 is configured to interact with the external device 110 using input/output signals (I/O signals 118) via one or more I/O pins 144 of the pins 108.

In some embodiments the electrical system 100 may be a safety critical system. As used herein, the terms "safety critical system" or "safety system" refer to a system that may cause damage to people, equipment, and/or an environment responsive to malfunctions of the safety critical system. Accordingly, the external device 110 may include a device associated with medical treatment, weapons, nuclear power, transportation, safety equipment, or other safety critical systems, without limitation.

In safety systems safety features are implemented that are intended to monitor and act on system states to operate it in a safe way. A failure in this context may be when a safety feature fails, which may potentially cause a hazard to the user. In such instances, failures may be detected and the system may be placed in a safe state to avoid a hazard. This mechanism ensures that even if the safety feature fails, the failure will not result in a hazard. This is also known as "functional safety" (i.e., the safety is functional). The integrated circuit device (e.g., integrated circuit device 114, integrated circuit device 126, without limitation) is configured to perform various safety functions configured to mitigate or detect and respond safely to failures of operation of the integrated circuit device 114 or 126. For example, the reset circuit 104 is configured to generate a system reset signal 120 (e.g., responsive to a first fault signal 134 generated by the timer circuit 102 and transmitted to the reset circuit 104 by the timer circuit 102, without limitation), and transmit the system reset signal 120 to various other parts of the integrated circuit device to initiate a system reset of the integrated circuit device 114 or 126. By way of non-limiting example, the system reset signal 120 may include a command to initiate a system reset, information indicating a condition of the integrated circuit device that requires triggering of a system reset, or some other signal configured to trigger the system reset. By way of non-limiting example, the reset circuit 104 may be configured to transmit the system reset signal 120 to the timer circuit 102, the I/O circuit 106, the interrupt circuit 130, and the main circuit 112. Responsive to the system reset signal 120 the I/O circuit 106 may be configured to control the I/O pins 144 to operate in an electrically floating state, i.e., the I/O circuit 106 may control the I/O pins 144 to set their state to the electrically floating state. When the I/O pins 144 are in the electrically floating state the integrated circuit device is in a safe state, which is safe within the safety critical system.

In some situations an additional fault of the reset circuit 104 itself may prevent a proper system reset from occurring. In such situations the timer circuit 102 may determine that a prior first fault signal 134 should have triggered the reset circuit 104 to trigger a system reset, but that the system reset did not occur. In such situations the timer circuit 102 may generate and transmit the reset signal 128 configured to trigger a system reset independently from the reset circuit 104. For example, the timer circuit 102 may be configured to transmit the reset signal 128 to the reset circuit 104, the I/O circuit 106, the interrupt circuit 130, and the main circuit 112 to initiate the system reset. Accordingly, even in the situation where an additional fault prevents the reset circuit 104 from triggering the system reset, i.e., prevents the reset circuit 104 from asserting the system reset signal 120, the timer circuit 102 may itself trigger the system reset independent of the reset circuit 104 by asserting the reset signal 128.

Another safety function the integrated circuit device 114 or 126 is configured to perform is an interrupt of operation of the main circuit 112. In some embodiments the main circuit 112 includes one or more processing cores such as a central processing unit (CPU). The interrupt circuit 130 may be configured to generate an interrupt 132 and transmit the interrupt 132 to the main circuit 112 to interrupt operation of the main circuit 112. By way of non-limiting example, the interrupt circuit 130 may be configured to generate the interrupt 132 responsive to a second fault signal 136 received from the timer circuit 102. The main circuit 112 may be configured to attempt to mitigate or eliminate a fault of the integrated circuit device 114 or 126 responsive to the interrupt 132.

In some situations an additional fault of the interrupt circuit 130 itself may prevent the interrupt of the main circuit 112 from occurring (e.g., failure to provide the interrupt 132 to the main circuit 112). In such situations the timer circuit 102 may determine that a prior second fault signal 136 should have triggered the interrupt circuit 130 to generate the interrupt 132 so as to interrupt the main circuit 112, but that the interrupt 132 did not occur. By way of non-limiting example, the interrupt circuit 130 may be operating in a state or configuration that turns off all or individual interrupts (e.g., due to proper operation of the interrupt circuit 130 or due to an additional fault in of the interrupt circuit 130). Also by way of non-limiting example, the interrupt circuit 130 may be busy handling another interrupt (e.g., due to proper operation of the interrupt circuit or due to an additional fault in the interrupt circuit 130), which prevents the interrupt circuit 130 from servicing the second fault signal 136 that should have triggered interrupt 132 responsive to the second fault signal. In such situations the timer circuit 102 may generate and transmit a non-maskable interrupt signal (NMI signal 122) to the interrupt circuit 130 to initiate the interrupt independently from the state and configuration of the interrupt circuit 130. Accordingly, even in the situation where an additional fault prevents the interrupt circuit 130 from triggering the interrupt 132, the timer circuit 102 may itself trigger an interrupt of the main circuit 112 through the interrupt circuit 130 by generating and transmitting the NMI signal 122 to the interrupt circuit 130. The NMI signal 122 may trigger the interrupt circuit 130 to provide the interrupt 132 regardless of whether interrupts are disabled, and the interrupt circuit 130 is configured to treat the NMI signal 122 with higher priority than other interrupts, which enables the interrupt circuit 130 to provide the interrupt 132 even if the interrupt circuit 130 was already servicing another interrupt. As a result, the interrupt circuit 130 may be configured to provide the interrupt 132 responsive to the NMI signal 122 regardless of a state and configuration of the interrupt circuit 130.

A further safety function of electrical system 100 includes a capability for the timer circuit 102 to independently trigger operation of the I/O pins 144 in an electrically floating state. For example, the timer circuit 102 may be configured to generate a safety signal 124 and transmit the safety signal 124 to the I/O circuit 106. The safety signal 124 is configured to trigger the I/O circuit 106 to control the I/O pins 144 to operate in the electrically floating state. By way of non-limiting example, the I/O circuit 106 may be configured to generate pin control signals 116 configured to control isolation circuitry of the I/O pins 144. In some embodiments such isolation circuitry of the I/O pins 144 may include driver circuits configured to drive input and output signals at the I/O pins 144 and the pin control signals 116 may be configured to deactivate the driver circuits, electrically isolating the I/O pins 144 from the rest of the circuitry of the integrated circuit device 114 or 126.

Figure 2:
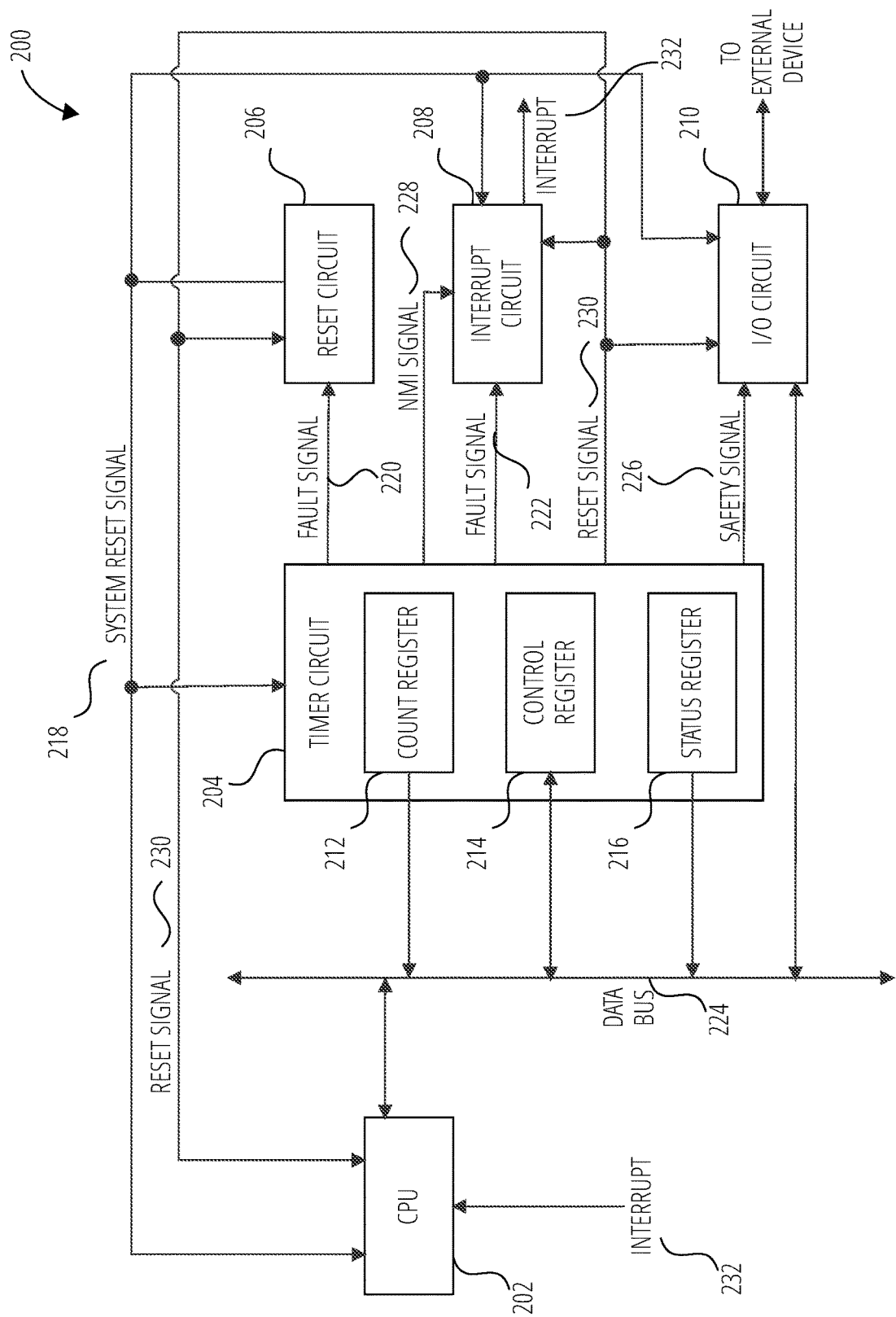
FIG. 2 is a block diagram of a processing circuit, according to some embodiments.

FIG. 2 is a block diagram of a processing circuit 200, according to some embodiments. The processing circuit 200 is an example of the integrated circuit device 126 of FIG. 1, including a timer circuit 204 similar to the timer circuit 102 of FIG. 1 integrated within the processing circuit 200. It should be understood that in some embodiments all or a portion of the timer circuit 204 may instead be implemented externally to the processing circuit 200, similar to the timer circuit 102 of the integrated circuit device 114 of FIG. 1. Although not shown in FIG. 2, the processing circuit 200 includes I/O pins similar to the I/O pins 144 of FIG. 1. In some embodiments the timer circuit 204 may include a watchdog circuit.

The processing circuit 200 also includes a CPU 202, a reset circuit 206, an interrupt circuit 208, an I/O circuit 210, and a data bus 224 operably coupled to the CPU 202 and the I/O circuit 210. The timer circuit 204 includes a count register 212, a control register 214, and a status register 216, each of which is operably coupled to the CPU 202 through the data bus 224, thus operably coupling the timer circuit 204 to the data bus 224. Responsive to a detection of a fault by the timer circuit 204, the timer circuit 204 may be configured to generate a fault signal (e.g., first fault signal 220 responsive to faults that merit a system reset, or second fault signal 222 responsive to faults that merit an interrupt of for example the CPU 202). By way of non-limiting example, the fault may be detected by monitoring the count register 212, thresholds for which may be controlled by the CPU 202 via the control register 214. The count register 212 may be configured to increment during performance of a task (e.g., by the CPU 202) until the count register 212 is stopped (e.g., via the control register 214) upon completion of the task. If the value of the count register 212 upon completion of the task is outside of a predetermined range of values defined by one or more threshold values, the timer circuit 204 may determine that a fault occurred. It should be noted that the timer circuit 204 may instead be implemented without the count register 212. By way of non-limiting example, the timer circuit may be implemented with an analog timeout such as an RC circuit.

In the case that the timer circuit 204 determines that the detected fault merits a system reset to remedy the fault (e.g., a critical fault), the timer circuit 204 may generate the first fault signal 220 and transmit the first fault signal 220 to the reset circuit 206. By way of non-limiting examples, detected faults that may merit a system reset may include an overflow of the count register 212 before the CPU clears the count register indicating completion of the task or clearing of the count register 212 earlier than is appropriate. The reset circuit 206 is configured to receive the first fault signal 220 and generate and transmit a system reset signal 218 responsive to the first fault signal 220. The system reset signal 218 may be transmitted to the CPU 202, the timer circuit 204, the interrupt circuit 208, and the I/O circuit 210.

In instances where the reset circuit 206 is not functioning correctly the reset circuit 206 may fail to provide the system reset signal 218 properly. In such instances the timer circuit 204 may be configured to initiate the system reset independently from the reset circuit 206. For example, the timer circuit 204 may be configured to generate a reset signal 230 and provide the reset signal 230 to the CPU 202, the reset circuit 206, the interrupt circuit 208, and the I/O circuit 210 to trigger the system reset. The system reset may cause the I/O circuit 210 to transition the I/O pins of the processing circuit 200 to an electrically floating state.

In the case that the timer circuit 204 determines that the detected fault merits an interrupt of the CPU 202, the timer circuit 204 may generate the second fault signal 222 and transmit the second fault signal 222 to the interrupt circuit 208. The interrupt circuit 208 may generate and transmit, to the CPU 202, an interrupt 232 responsive to the second fault signal 222 to interrupt the CPU. The interrupt 232 of the CPU 202 may be the first part of a two-part sequence, which includes the interrupt 232 of the CPU 202 followed by a system reset. By way of non-limiting examples, detected faults that may merit an interrupt of the CPU 202 and optionally a system reset may include an overflow of the count register 212 before the CPU 202 clears the count register or clearing of the count register 212 earlier than is appropriate. The interrupt of the CPU 202 may cause the CPU 202 to signal the I/O circuit 210 to transition the I/O pins of the processing circuit 200 to an electrically floating state. It is noted that an interrupt of the CPU 202 by the timer circuit 204 through the assertion of second fault signal 222 may be done as a first response to the incorrect clearing of the timer circuit 204 to allow the CPU 202 to bring the system down gracefully in preparation for the following system reset (e.g., to save the system state, make an error log entry, communicate the failure to other parts of a system, without limitation). After the interrupt of the CPU 202 by the timer circuit 204 through interrupt circuit 208, a system reset initiated by the timer circuit 204 may follow as the second part of the two-part sequence. Accordingly, by way of non-limiting example, a two operation sequence may first include the interrupt by the timer circuit 204 (and floating of the I/O pins) through second fault signal 222 and interrupt circuit 208 followed by a system reset by the timer circuit 204 through first fault signal 220 and reset circuit 206. The interrupt circuit 208 is configured to receive the second fault signal 222 and generate and transmit an interrupt 232 to the CPU 202 to interrupt operation of the CPU 202.

In instances where the interrupt circuit 208 is not functioning correctly the interrupt circuit 208 may fail to provide the interrupt to the CPU 202. In such instances the timer circuit 204 may be configured to initiate the interrupt independently from a state and configuration of the interrupt circuit 208. For example, the timer circuit 204 may be configured to generate an NMI signal 228 and provide the NMI signal 228 to the interrupt circuit 208, which in turn may provide the interrupt 232 to the CPU 202 responsive to the NMI signal 228.

In the case that the timer circuit 204 determines that the detected fault merits a transition of the I/O pins of the processing circuit 200 into an electrically floating state, the timer circuit 204 may generate a safety signal 226 similar to the safety signal 124 of FIG. 1, and transmit the safety signal 226 to the I/O circuit 210. By way of non-limiting examples, detected faults that may merit a transition of the I/O pins of the processing circuit 200 into an electrically floating state may include an overflow of the count register 212 before the CPU clears the count register or clearing of the count register 212 earlier than is appropriate. The I/O circuit 210 is configured to receive the safety signal 226 and transition the I/O pins to an electrically floating state. In this way the timer circuit 204 is configured to initiate the I/O circuit 210 to transition the I/O pins to the electrically floating state independently from the CPU 202 and the reset circuit 206.

Figure 3:
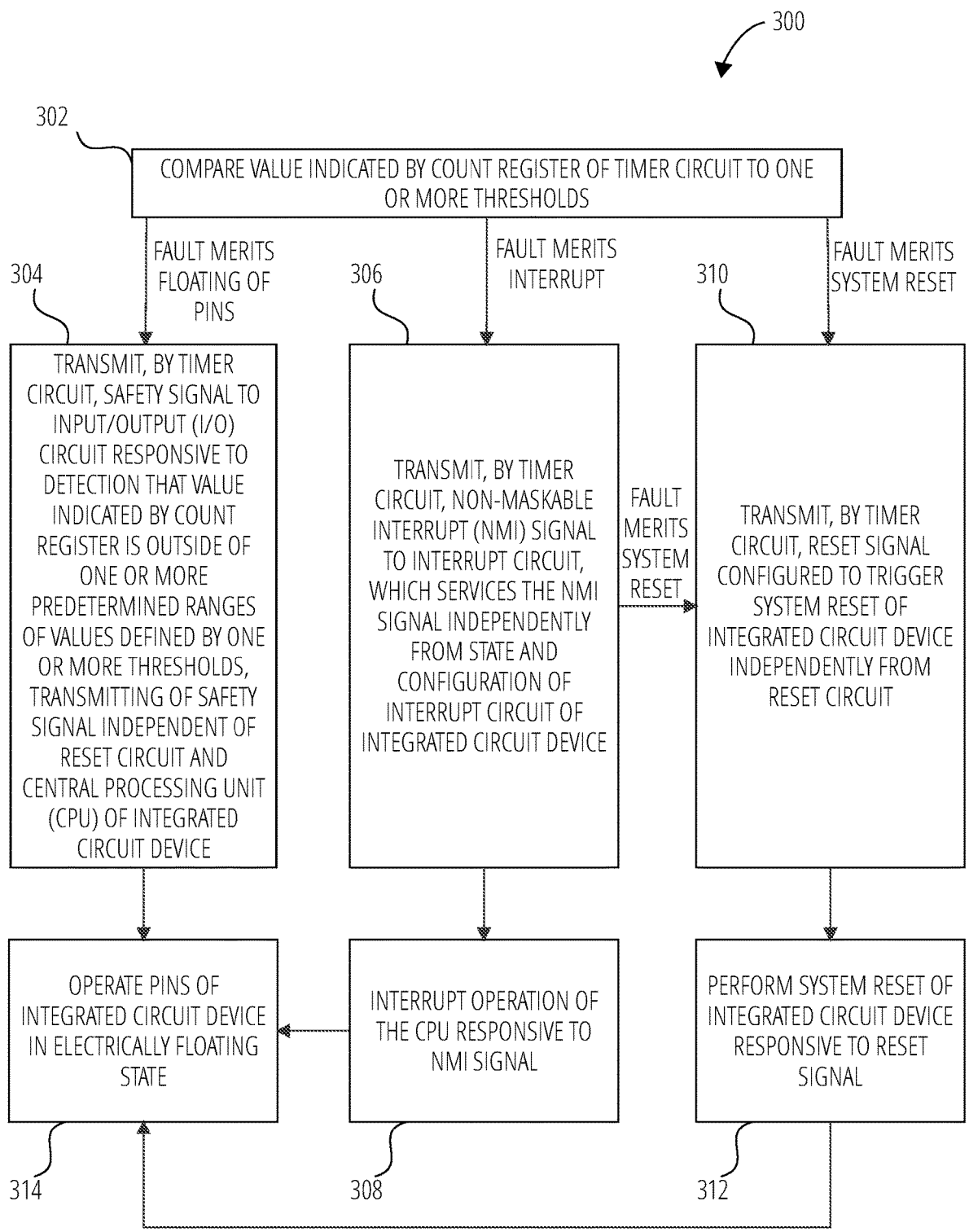
FIG. 3 is a flowchart illustrating a method of operating an integrated circuit device, according to some embodiments.

FIG. 3 is a flowchart illustrating a method 300 of operating an integrated circuit device, according to some embodiments. At operation 302, method 300 includes comparing a value indicated by a count register of a timer circuit (e.g., the timer circuit 102 of FIG. 1 or the count register 212 of the timer circuit 204 of FIG. 2) to one or more thresholds. By way of non-limiting example, the count register may be configured to increment during performance of a task until the count register is stopped upon completion of the task. If the completion value of the count register falls outside of a range defined by the one or more thresholds upon completion of the task, it may be determined that a fault occurred.

In some instances the timer circuit may determine that the fault merits a transition of I/O pins of the integrated circuit device into an electrically floating state. In such instances, at operation 304, method 300 includes transmitting, by the timer circuit, a safety signal to an input/output (I/O) circuit responsive to a detection that the value indicated by the count register is outside of one or more predetermined ranges of values defined by the one or more thresholds. The transmitting of the safety signal is independent of a reset circuit and a central processing unit (CPU) of the integrated circuit device. At operation 314, method 300 includes operating I/O pins of the integrated circuit device in an electrically floating state responsive to the safety signal. Accordingly, regardless of whether the reset circuit and/or the I/O circuit experiences a fault, the I/O circuit may still receive the safety signal from the timer circuit and operate the I/O pins in the electrically floating state.

In some instances the timer circuit may determine that the fault merits an interrupt of operation of the CPU. In such instances, at operation 306, method 300 includes transmitting, by the timer circuit, a non-maskable interrupt (NMI) signal to an interrupt circuit, which services the NMI signal independently from a state and a configuration of the interrupt circuit of the integrated circuit device. In such instances, the method 300 also includes, at operation 308, interrupting operation of the CPU responsive to the NMI signal. Responsive to the interrupt of operation of the CPU, at operation 314 method 300 includes operating I/O pins of the integrated circuit device in an electrically floating state. Returning to operation 306, if it is determined that the fault also merits a system reset (e.g., as a second part of a two-part sequence including the CPU interrupt and the system reset), at operation 310 the method 300 includes transmitting, by the timer circuit, a reset signal (e.g., reset signal 128 of FIG. 1 or reset signal 230 of FIG. 2) configured to trigger a system reset of the integrated circuit device independently from the reset circuit (e.g., reset circuit 104 of FIG. 1 and reset circuit 206 of FIG. 2). In such instances at operation 312 method 300 includes resetting the integrated circuit device responsive to the reset signal. Responsive to the system reset, at operation 314, method 300 includes operating I/O pins of the integrated circuit device in an electrically floating state.

Returning to operation 302, in some instances the timer circuit may determine that the fault merits a system reset. At operation 310, method 300 includes transmitting, by the timer circuit, a reset signal (e.g., reset signal 128 of FIG. 1 or reset signal 230 of FIG. 2) configured to trigger a system reset of the integrated circuit device independently from the reset circuit (e.g., reset circuit 104 of FIG. 1 and reset circuit 206 of FIG. 2). In such instances at operation 312 method 300 includes resetting the integrated circuit device responsive to the reset signal. Responsive to the system reset, at operation 314, method 300 includes operating I/O pins of the integrated circuit device in an electrically floating state.

The I/O pins may be brought to an electrically floating state (i.e., a safe state) responsive to any one or more of operation 304 (transmitting a safety signal), operation 308 (interrupting operation of the CPU responsive to the NMI signal), and operation 312 (performing a system reset of the integrated circuit device responsive to the reset signal), which may be triggered independently from each other. As a result, even if one or two of these operations fails, the system can still be brought to a safe state via the remaining one or two of these operations.

Figure 4:
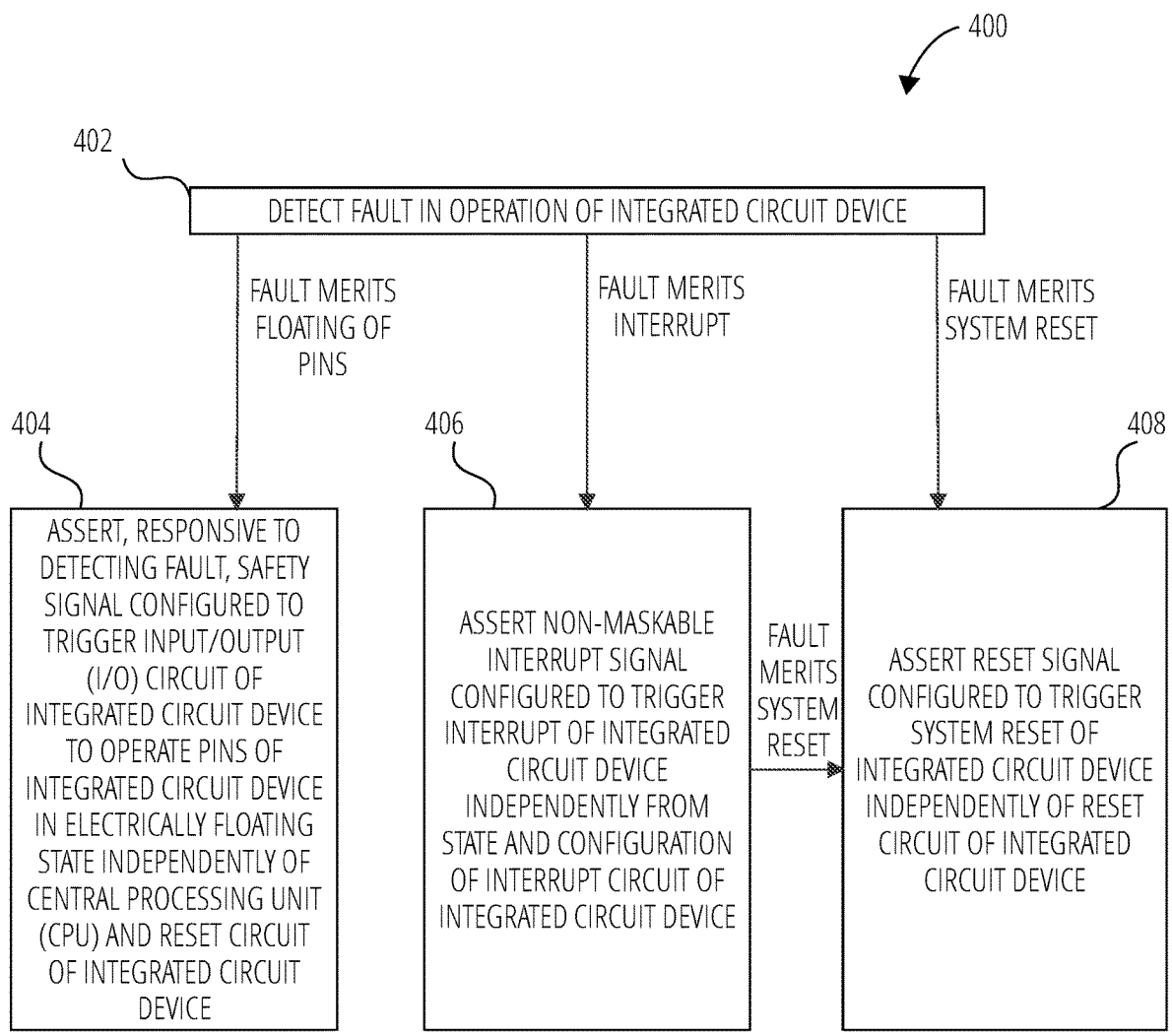
FIG. 4 is a flowchart illustrating a method of operating a timer circuit, according to some embodiments.

FIG. 4 is a flowchart illustrating a method 400 of operating a timer circuit (e.g., the timer circuit 102 or the timer circuit 204 of FIG. 1), according to some embodiments. At operation 402, method 400 includes detecting a fault in operation of an integrated circuit device. By way of non-limiting examples, a fault in operation of the integrated circuit device may include a soft fault, a hard fault, stack pointer failures, a timer clearing too late or too early, other faults, or combinations thereof. Also by way of non-limiting example, a fault may be a fault in a reset controller (e.g., the reset circuit 104 of FIG. 1 or the reset circuit 206 of FIG. 2).

The detected fault may merit any one or more of various remedial actions by the timer circuit, as will be discussed below.

In some instances the fault may merit floating of I/O pins of the integrated circuit device. In such instances at operation 404, method 400 includes asserting, responsive to detecting the fault, a safety signal (e.g., safety signal 124 of FIG. 1 or safety signal 226 of FIG. 2) configured to trigger an input/output (I/O) circuit (e.g., the I/O circuit 106 of FIG. 1 or the I/O circuit 210 of FIG. 2) of the integrated circuit device to operate I/O pins of the integrated circuit device in an electrically floating state independently of a central processing unit (CPU) and a reset circuit of the integrated circuit device. By way of non-limiting example, the safety signal may be configured to trigger the I/O circuit to generate pin control signals (e.g., the pin control signals 116 of FIG. 1) configured to control isolation circuitry of the I/O pins.

Returning to operation 402, in some instances the detected fault may merit an interrupt of the integrated circuit device. In such instances at operation 406, method 400 includes asserting an NMI signal (e.g., the NMI signal 122 of FIG. 1 or the NMI signal 228 of FIG. 2) configured to trigger an interrupt of the integrated circuit device independently of a state and configuration of an interrupt circuit of the integrated circuit device. By way of non-limiting example the NMI signal may be asserted by a timer circuit, which may be included in or external to the integrated circuit device. Also by way of non-limiting example, the NMI signal may be provided to an interrupt circuit, which may, in turn, provide an interrupt to a main circuit such as a processing core (e.g., a CPU) of a microcontroller. In some instance where the detected fault merits an interrupt, the detected fault may also merit a system reset as part of a two-part sequence involving an interrupt and a reset. In such instances, at operation 408, method 400 includes asserting a reset signal (e.g., the reset signal 128 of FIG. 1 or the reset signal 230 of FIG. 2) configured to trigger a system reset of the integrated circuit device independently of the reset circuit of the integrated circuit device.

Returning to operation 402, in some instances the detected fault may merit a system reset. At operation 408, method 400 includes asserting a reset signal (e.g., the reset signal 128 of FIG. 1 or the reset signal 230 of FIG. 2) configured to trigger a system reset of the integrated circuit device independently of the reset circuit of the integrated circuit device. By way of non-limiting example, the reset signal may trigger one or more of a main circuit (e.g., a processing core), an interrupt circuit, and an I/O circuit of the integrated circuit device to trigger the system reset. Also by way of non-limiting example, a timer circuit may be configured to assert the reset signal.

Figure 5:
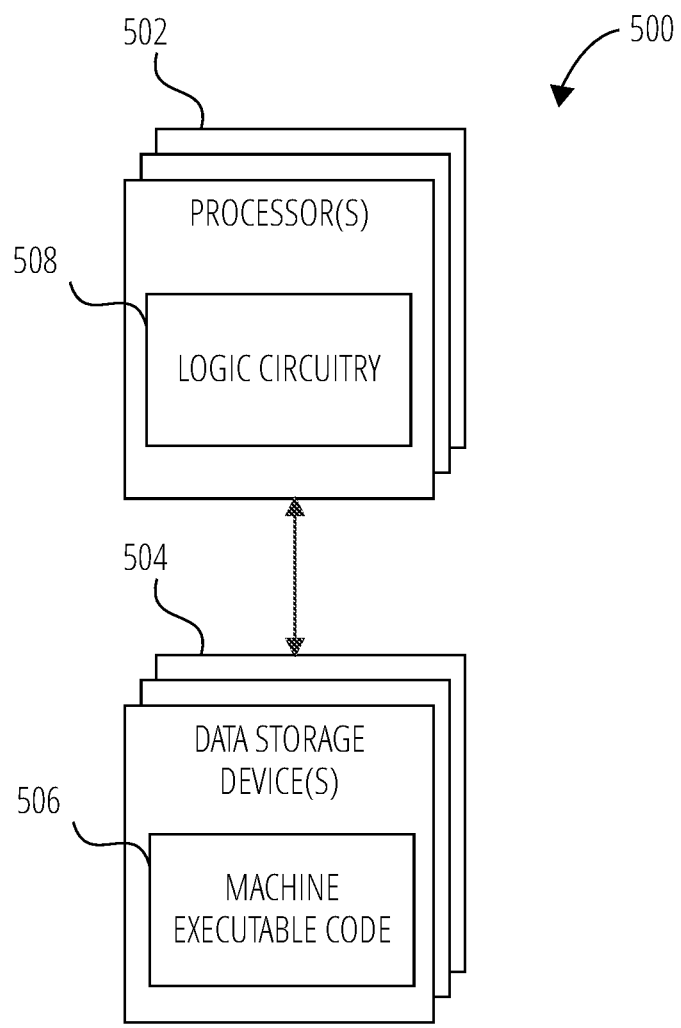
FIG. 5 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 5 illustrates non-limiting examples of implementations of functional elements disclosed herein. In some embodiments, some or all portions of the functional elements disclosed herein may be performed by hardware specially configured for carrying out the functional elements.

FIG. 5 is a block diagram of circuitry 500 that, in some embodiments, may be used to implement various functions, operations, acts, processes, and/or methods disclosed herein. The circuitry 500 includes one or more processors 502 (sometimes referred to herein as "processors 502") operably coupled to one or more data storage devices (sometimes referred to herein as "storage 504"). The storage 504 includes machine executable code 506 stored thereon and the processors 502 include logic circuitry 508. The machine executable code 506 includes information describing functional elements that may be implemented by (e.g., performed by) the logic circuitry 508. The logic circuitry 508 is adapted to implement (e.g., perform) the functional elements described by the machine executable code 506. The circuitry 500, when executing the functional elements described by the machine executable code 506, should be considered as special purpose hardware configured for carrying out functional elements disclosed herein. In some embodiments the processors 502 may be configured to perform the functional elements described by the machine executable code 506 sequentially, concurrently (e.g., on one or more different hardware platforms), or in one or more parallel process streams.

When implemented by logic circuitry 508 of the processors 502, the machine executable code 506 is configured to adapt the processors 502 to perform operations of embodiments disclosed herein. For example, the machine executable code 506 may be configured to adapt the processors 502 to perform at least a portion or a totality of the method 300 of FIG. 3 and/or the method 400 of FIG. 4. As another example, the machine executable code 506 may be configured to adapt the processors 502 to perform at least a portion or a totality of the operations discussed for the main circuit 112 of FIG. 1 (e.g., the main circuit 112 may be at least partially implemented as the processors 502). As another example, the machine executable code 506 may be configured to adapt the processors 502 to perform at least a portion or a totality of the operations discussed for the CPU 202 of FIG. 2 (e.g., the CPU 202 may be implemented at least partially as the processors 502).

The processors 502 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 506 (e.g., software code, firmware code, hardware descriptions) related to embodiments of the present disclosure. It is noted that a general-purpose processor (may also be referred to herein as a host processor or simply a host) may be a microprocessor, but in the alternative, the processors 502 may include any conventional processor, controller, microcontroller, or state machine. The processors 502 may also be implemented as a combination of computing devices, such as a combination of a DSP and a microprocessor, a plurality of microprocessors, one or more microprocessors in conjunction with a DSP core, or any other such configuration.

In some embodiments the storage 504 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 502 and the storage 504 may be implemented into a single device (e.g., a semiconductor device product, a system on chip (SOC), etc.). In some embodiments the processors 502 and the storage 504 may be implemented into separate devices.

In some embodiments the machine executable code 506 may include computer-readable instructions (e.g., software code, firmware code). By way of non-limiting example, the computer-readable instructions may be stored by the storage 504, accessed directly by the processors 502, and executed by the processors 502 using at least the logic circuitry 508. Also by way of non-limiting example, the computer-readable instructions may be stored on the storage 504, transferred to a memory device (not shown) for execution, and executed by the processors 502 using at least the logic circuitry 508. Accordingly, in some embodiments the logic circuitry 508 includes electrically configurable logic circuitry 508.

In some embodiments the machine executable code 506 may describe hardware (e.g., circuitry) to be implemented in the logic circuitry 508 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™, SystemVerilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 508 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 506 may include an HDL, an RTL, a GL description, a mask level description, other hardware description, or any combination thereof.

In embodiments where the machine executable code 506 includes a hardware description (at any level of abstraction), a system (not shown, but including the storage 504) may be configured to implement the hardware description described by the machine executable code 506. By way of non-limiting example, the processors 502 may include a programmable logic device (e.g., an FPGA or a PLC) and the logic circuitry 508 may be electrically controlled to implement circuitry corresponding to the hardware description into the logic circuitry 508. Also by way of non-limiting example, the logic circuitry 508 may include hard-wired logic manufactured by a manufacturing system (not shown, but including the storage 504) according to the hardware description of the machine executable code 506.

Regardless of whether the machine executable code 506 includes computer-readable instructions or a hardware description, the logic circuitry 508 is adapted to perform the functional elements described by the machine executable code 506 when implementing the functional elements of the machine executable code 506. It is noted that although a hardware description may not directly describe functional elements, a hardware description indirectly describes functional elements that the hardware elements described by the hardware description are capable of performing.

EXAMPLES

A non-exhaustive, non-limiting list of example embodiments follows. Not each of the example embodiments listed below are explicitly and individually indicated as being combinable with all others of the example embodiments listed below and embodiments discussed above. It is intended, however, that these example embodiments are combinable with all other example embodiments and embodiments discussed above unless it would be apparent to one of ordinary skill in the art that the embodiments are not combinable.

Example 1: An electrical system, comprising: a timer circuit; and an integrated circuit device, the integrated circuit device comprising: input/output (I/O) pins configured to conduct I/O signals between internal circuitry of the integrated circuit device and a device that is external to the integrated circuit device; a reset circuit configured to transmit a system reset signal responsive to a fault signal received from the timer circuit, the system reset signal to trigger a system reset of the integrated circuit device; an I/O circuit operably coupled to the I/O pins, the I/O circuit configured to selectively operate the I/O pins in an electrically floating state responsive to the system reset of the integrated circuit device, the I/O circuit further configured to selectively operate the I/O pins in the electrically floating state responsive to a signal provided by the timer circuit independently from the reset circuit.

Example 2: The electrical system of Example 1, wherein the signal provided by the timer circuit comprises a safety signal.

Example 3: The electrical system according to any one of Examples 1 and 2, wherein the integrated circuit device further comprises a central processing unit (CPU) and an interrupt circuit, the interrupt circuit is configured to receive a non-maskable interrupt signal from the timer circuit, and the interrupt circuit is configured to trigger an interrupt of the CPU responsive to the received non-maskable interrupt signal independently of a state and a configuration of the interrupt circuit.

Example 4: The electrical system according to any one of Examples 1-3, wherein the integrated circuit device further comprises the timer circuit.

Example 5: The electrical system according to any one of Examples 1-3, wherein the timer circuit is external to the integrated circuit device.

Example 6: The electrical system of Example 5, further comprising a safety pin operably coupled to the timer circuit, wherein the timer circuit is configured to provide a safety signal as the signal provided by the timer circuit to the I/O circuit via the safety pin.

Example 7: The electrical system according to any one of Examples 5 and 6, further comprising an interrupt pin operably coupled to the timer circuit, wherein the timer circuit is configured to provide a non-maskable interrupt signal to an interrupt circuit of the integrated circuit device via the interrupt pin.

Example 8: The electrical system according to any one of Examples 5 and 7, further comprising a reset pin operably coupled to the timer circuit, wherein the timer circuit is configured to provide a reset signal as the signal provided by the timer circuit to the integrated circuit device via the reset pin, the reset signal configured to trigger the system reset of the integrated circuit device independently from the system reset signal.

Example 9: A processing circuit, comprising: input/output (I/O) pins configured to conduct I/O signals between the processing circuit and a device that is external to the processing circuit; an I/O circuit configured to selectively operate the I/O pins in an electrically floating state; a reset circuit configured to transmit a system reset signal configured to initiate a system reset of the processing circuit, the system reset signal further configured to trigger the I/O circuit to operate the I/O pins in the electrically floating state; and a timer circuit operably coupled to the I/O circuit, the timer circuit configured to transmit a safety signal to the I/O circuit, the safety signal configured to trigger the I/O circuit to operate the I/O pins in the electrically floating state independently of the system reset signal.

Example 10: The processing circuit of Example 9, further comprising: a central processing unit (CPU) operably coupled to the timer circuit; and an interrupt circuit operably coupled to the timer circuit and to the CPU, wherein the timer circuit is further configured to transmit a non-maskable interrupt signal to the interrupt circuit, the interrupt circuit configured to interrupt the CPU independently from a state and configuration of the interrupt circuit.

Example 11: The processing circuit according to any one of Examples 9 and 10, further comprising an interrupt circuit and a central processing unit (CPU) each operably coupled to the timer circuit, wherein the timer circuit is further configured to transmit a reset signal to the CPU, the I/O circuit, and the interrupt circuit, wherein the reset signal is configured to trigger the system reset of the processing circuit independently from the system reset signal of the reset circuit.

Example 12: The processing circuit according to any one of Examples 9-11, wherein the timer circuit is further configured to transmit a fault signal to the reset circuit responsive to a detection of a fault of the processing circuit.

Example 13: A method of operating an integrated circuit device, the method comprising: comparing a value indicated by a count register of a timer circuit to one or more thresholds; transmitting, by the timer circuit, a safety signal to an input/output (I/O) circuit responsive to a detection that the value indicated by the count register is outside of one or more predetermined ranges of values defined by the one or more thresholds, the transmitting of the safety signal independent of a reset circuit and a central processing unit (CPU) of the integrated circuit device; and operating I/O pins of the integrated circuit device in an electrically floating state responsive to the safety signal.

Example 14: The method of Example 13, further comprising transmitting, by the timer circuit, a non-maskable interrupt signal to an interrupt circuit of the integrated circuit device responsive to a determination that a detected fault merits an interrupt to operation of the CPU.

Example 15: The method of Example 14, further comprising transmitting, by the timer circuit, a reset signal configured to trigger a system reset of the integrated circuit device independently from the reset circuit responsive to a determination that the detected fault merits the system reset.

Example 16: The method of Example 15, wherein the non-maskable interrupt signal is transmitted prior to transmitting the reset signal.

Example 17: A method of operating a timer circuit, the method comprising: detecting a fault in operation of an integrated circuit device: asserting, responsive to a determination that the detected fault merits floating of I/O pins, a safety signal configured to trigger an input/output (I/O) circuit of the integrated circuit device to operate I/O pins of the integrated circuit device in an electrically floating state independently of a central processing unit (CPU) and a reset circuit of the integrated circuit device; asserting, responsive to a determination that the detected fault merits an interrupt of the integrated circuit device, a non-maskable interrupt signal configured to trigger the interrupt of the integrated circuit device independently of a state and configuration of an interrupt circuit of the integrated circuit device; and asserting, responsive to a determination that the detected fault merits a system reset, a reset signal configured to trigger a system reset of the integrated circuit device independently of the reset circuit of the integrated circuit device.

Example 18: The method of Example 17, wherein the timer circuit is external to the integrated circuit device.

Example 19: The method of Example 17, wherein the integrated circuit device includes the timer circuit.

Example 20: An electrical system, comprising: an integrated circuit device, comprising: pins configured to conduct input/output (I/O) signals between internal circuitry of the integrated circuit device and a device that is external to the integrated circuit device; a reset circuit configured to transmit a system reset signal responsive to a fault signal received from a timer circuit, the system reset signal configured to trigger a system reset of the integrated circuit device; an I/O circuit operably coupled to the pins, the I/O circuit configured to selectively operate the pins in an electrically floating state responsive to the system reset signal transmitted by the reset circuit, the I/O circuit further configured to selectively operate the pins in the electrically floating state responsive to a safety signal received from the timer circuit independently from the system reset signal, the reset circuit, and a central processing unit (CPU) of the integrated circuit device.

Example 21: The processing circuit of Example 20, wherein the integrated circuit device is implemented as a microcontroller.

Example 22: The processing circuit according to any one of Examples 20 and 21, wherein the CPU is configured to receive a non-maskable interrupt signal from the timer circuit, the non-maskable interrupt signal configured to trigger a non-maskable interrupt of the CPU independent of an interrupt circuit of the integrated circuit device.

Example 23: The processing circuit according to any one of Examples 20-22, wherein the integrated circuit device further comprises the timer circuit.

Example 24: The processing circuit according to any one of Examples 20-22, further comprising the timer circuit, wherein the timer circuit is external to the integrated circuit device.

Example 25: The processing circuit of Example 24, wherein the pins include a safety pin operably coupled to the timer circuit, wherein the timer circuit is configured to provide the safety signal to the I/O circuit via the safety pin.

Example 26: The processing circuit according to any one of Examples 24 and 25, wherein the pins include an interrupt pin operably coupled to the timer circuit, wherein the timer circuit is configured to provide a non-maskable interrupt signal to the CUP via the interrupt pin independently from an interrupt circuit of the integrated circuit device.

Example 27: The processing circuit according to any one of Examples 24-26, wherein the pins include a reset pin operably coupled to the timer circuit, wherein the timer circuit is configured to provide a reset signal to the integrated circuit device via the reset pin, the reset signal configured to trigger the system reset of the integrated circuit device.

Example 28: A processing circuit, comprising: pins configured to conduct input/output (I/O) signals between the processing circuit and a device that is external to the processing circuit; an I/O circuit configured to selectively operate the pins in an electrically floating state; a reset circuit configured to transmit a system reset signal configured to initiate a system reset of the processing circuit, the system reset signal further configured to trigger the I/O circuit to operate the pins in the electrically floating state; and a watchdog circuit operably coupled to the I/O circuit, the watchdog circuit configured to transmit a safety signal to the I/O circuit, the safety signal configured to trigger the I/O circuit to operate the pins in the electrically floating state independently of the reset circuit and the system reset signal.

Example 29: The processing circuit of Example 28, further comprising a central processing unit (CPU) operably coupled to the watchdog circuit, wherein: the watchdog circuit is further configured to transmit, independently of an interrupt circuit of the processing circuit, a non-maskable interrupt signal to the CPU; and the interrupt circuit is configured to initiate a non-maskable interrupt of the CPU responsive to the non-maskable interrupt signal received from the watchdog circuit.

Example 30: The processing circuit according to any one of Examples 28 and 29, further comprising a central processing unit (CPU) operably coupled to the watchdog circuit, wherein the watchdog circuit is further configured to transmit a reset signal to the CPU, the I/O circuit, and an interrupt circuit, wherein the reset signal is configured to trigger the system reset independently from the system reset signal, the reset circuitry, and the CPU.

Example 31: The processing circuit according to any one of Examples 28-30, wherein the watchdog circuit is further configured to transmit a fault signal to the reset circuit responsive to a detection of a fault of the processing circuit.

Example 32: The processing circuit according to any one of Examples 28-31, wherein the processing circuit is implemented as a microcontroller.

Example 33: A method of operating an integrated circuit device, the method comprising: comparing a value indicated by a count register of a timer circuit to one or more thresholds; transmitting, by the timer circuit to an input/output (I/O) circuit, a safety signal to an input/output (I/O) circuit responsive to a detection that the value indicated by the count register is outside of one or more predetermined ranges of values defined by the one or more thresholds, the transmitting of the safety signal independent of a reset circuit and a central processing unit (CPU) of the integrated circuit device; and operating pins of the integrated circuit device in an electrically floating state responsive to the safety signal.

Example 34: The method of Example 33, further comprising transmitting, by the timer circuit, a non-maskable interrupt signal to the CPU independently from an interrupt circuit of the integrated circuit device.

Example 35: The method of Example 34, further comprising transmitting, by the timer circuit, a reset signal configured to trigger a system reset of the integrated circuit device independently from the reset circuit.

Example 36: The method of Example 35, wherein the non-maskable interrupt signal is transmitted prior to transmitting the reset signal to enable the CPU to confirm that the pins are operated in the electrically floating state.

Example 37: The method of Example 35, wherein the non-maskable interrupt signal is transmitted prior to transmitting the reset signal to enable the CPU to control the I/O circuit to operate the pins in the electrically floating state if it is confirmed that the pins are not operating in the electrically floating state.

Example 38: A method of operating a timer circuit, the method comprising: detecting a fault in operation of an integrated circuit device: asserting, responsive to detecting the fault, a safety signal configured to trigger an input/output (I/O) circuit of the integrated circuit device to operate pins of the integrated circuit device in an electrically floating state independently of a central processing unit (CPU) and a reset circuit of the integrated circuit device; asserting a non-maskable interrupt signal configured to trigger an interrupt of the integrated circuit device independently of an interrupt circuit of the integrated circuit device; and asserting a reset signal configured to trigger a system reset of the integrated circuit device independently of the reset circuit of the integrated circuit device.

CONCLUSION

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An electrical system, comprising:
   a timer circuit to generate and transmit a plurality of signals; and
   an integrated circuit device operatively coupled to the timer circuit, comprising:
   a central processing unit (CPU);
   input/output (I/O) pins to conduct I/O signals between internal circuitry of the integrated circuit device and a device that is external to the integrated circuit device;
   a reset circuit to generate a reset signal responsive to a first signal of the plurality of signals transmitted from the timer circuit, the reset signal to trigger a system reset of the integrated circuit device; and
   an I/O circuit operably coupled to the I/O pins, the I/O circuit to operate the I/O pins in an electrically floating state responsive to a second signal of the plurality of signals transmitted by the timer circuit independent of the reset circuit.

2. The electrical system of claim 1, wherein the second signal transmitted by the timer circuit comprises a safety signal.

3. The electrical system of claim 1, wherein the integrated circuit device comprises an interrupt circuit, the interrupt circuit receiving a third signal transmitted from the timer circuit, wherein the interrupt circuit to trigger an interrupt of the CPU responsive to the received third signal independent of a state and a configuration of the interrupt circuit.

4. The electrical system of claim 3, wherein the third signal comprises a non-maskable interrupt (NMI) signal.

5. The electrical system of claim 1, wherein the timer circuit is external to the integrated circuit device.

6. The electrical system of claim 1, wherein the first signal comprises a fault signal.

7. The electrical system of claim 3, wherein the interrupt circuit of the integrated circuit device to receive a fourth signal from the timer circuit, the fourth signal to trigger an interrupt.

8. The electrical system of claim 5, wherein the timer circuit to transmit a fifth signal of the plurality of signals to the integrated circuit device the fifth signal to trigger the system reset of the integrated circuit device independently of the reset circuit.

9. A processing circuit, comprising:
input/output (I/O) pins to conduct I/O signals between the processing circuit and a device that is external to the processing circuit;
an I/O circuit to selectively operate the I/O pins in an electrically floating state;
a reset circuit to, responsive to receipt of a fault signal, transmit a system reset signal to initiate a system reset of the processing circuit, the system reset to trigger the I/O circuit to operate the I/O pins in the electrically floating state; and
a timer circuit operably coupled to the I/O circuit and the reset circuit, the timer circuit to transmit a safety signal only to the I/O circuit, the safety signal to trigger the I/O circuit to operate the I/O pins in the electrically floating state independent of the system reset initiated via the reset circuit.

10. The processing circuit of claim 9, comprising:
a central processing unit (CPU), the CPU operably coupled to the timer circuit; and
an interrupt circuit operably coupled to the timer circuit and to the CPU,
wherein the timer circuit to transmit a non-maskable interrupt signal to the interrupt circuit, the interrupt circuit to trigger an interrupt of the CPU, the interrupt initiable independently from a state and configuration of the interrupt circuit.

11. The processing circuit of claim 9, comprising an interrupt circuit, and a central processing unit (CPU), the interrupt circuit and the CPU operably coupled to the timer circuit, wherein the timer circuit is to generate and transmit a reset signal to the CPU, the I/O circuit, and the interrupt circuit, wherein the reset signal to trigger a system reset of the processing circuit independently from the system reset signal of the reset circuit.

12. The processing circuit of claim 9, wherein the timer circuit to transmit fault signal to the reset circuit responsive to a detection of a fault of the processing circuit.

13. A method of operating an integrated circuit device, the method comprising:
comparing a value indicated by a count register of a timer circuit to one or more thresholds, the one or more thresholds controlled by a central processing unit (CPU);
transmitting, by the timer circuit, a safety signal only to an input/output (I/O) circuit responsive to a detection that the value indicated by the count register is outside of one or more predetermined ranges of values defined by the one or more thresholds, the transmitting of the safety signal independent of either of a reset circuit and the CPU of the integrated circuit device; and
operating I/O pins of the integrated circuit device in an electrically floating state responsive to the safety signal.

14. The method of claim 13, comprising transmitting, by the timer circuit, a non-maskable interrupt signal to an interrupt circuit of the integrated circuit device responsive to a determination that a detected fault merits an interrupt to operation of the CPU.

15. The method of claim 14, comprising transmitting, by the timer circuit, a reset signal to trigger a system reset of the integrated circuit device independently from the reset circuit responsive to a determination that the detected fault merits the system reset.

16. The method of claim 15, wherein the non-maskable interrupt signal is transmitted prior to transmitting the reset signal.

17. A method of operating a timer circuit, the method comprising:
detecting a fault in operation of an integrated circuit device;
asserting, responsive to a determination that the detected fault merits floating of input/output (I/O) pins, a first signal to trigger an I/O circuit of the integrated circuit device to operate I/O pins of the integrated circuit device in an electrically floating state independently of a central processing unit (CPU) or a reset circuit of the integrated circuit device;
asserting, responsive to a determination that the detected fault merits an interrupt of the integrated circuit device, a second signal to trigger a non-maskable interrupt of the integrated circuit device independently of a state and configuration of an interrupt circuit of the integrated circuit device; and
asserting, responsive to a determination that the detected fault merits a system reset, a third signal to trigger the system reset of the integrated circuit device independently of the reset circuit of the integrated circuit device.

18. The method of claim 17, wherein detecting a fault comprises:
comparing a value indicated by a count register of the timer circuit to one or more thresholds; and
transmitting the third signal to place the integrated circuit device in a safe state.

19. The method of claim 18, wherein the third signal is a system reset signal.

20. The method of claim 13, comprising: implementing a functional safety mechanism to place the integrated circuit in a safe state responsive to a detected fault.

* * * * *